United States Patent
Takemura

(10) Patent No.: US 8,994,003 B2
(45) Date of Patent: Mar. 31, 2015

(54) POWER-INSULATED-GATE FIELD-EFFECT TRANSISTOR

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 294 days.

(21) Appl. No.: 13/236,035

(22) Filed: Sep. 19, 2011

(65) Prior Publication Data

US 2012/0068183 A1  Mar. 22, 2012

(30) Foreign Application Priority Data

Sep. 22, 2010  (JP) .................................. 2010-212185

(51) Int. Cl.
*H01L 29/12* (2006.01)
*H01L 29/786* (2006.01)

(52) U.S. Cl.
CPC .................................. *H01L 29/7869* (2013.01)
USPC .................. 257/20; 257/24; 257/27; 257/57; 257/66; 257/124; 257/E21.619; 257/E21.634; 257/E21.676

(58) Field of Classification Search
USPC ............... 257/20, 24, 27, 57, 66, 60, 69, 124, 257/133, 213, 192–197, 256, 262, 272–274, 257/325–328, 392–393, E51.005–E51.006, 257/E29.021–E29.025, E29.039–E29.041, 257/E29.122, E29.131, E29.268, E29.279, 257/E21.43, E21.692
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,929,449 A * | 7/1999 | Huang ..................... 250/370.09 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — David Vu
*Assistant Examiner* — Cuong B Nguyen
(74) *Attorney, Agent, or Firm* — Fish & Richardson P.C.

(57) ABSTRACT

To provide a power MISFET using oxide semiconductor. A gate electrode, a source electrode, and a drain electrode are formed so as to interpose a semiconductor layer therebetween, and a region of the semiconductor layer where the gate electrode and the drain electrode do not overlap with each other is provided between the gate electrode and the drain electrode. The length of the region is from 0.5 μm to 5 μm. In such a power MISFET, a power source of 100 V or higher and a load are connected in series between the drain electrode and the source electrode, and a control signal is input to the gate electrode.

30 Claims, 10 Drawing Sheets

(56) References Cited

U.S. PATENT DOCUMENTS

| | | | |
|---|---|---|---|
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199879 | A1 | 9/2005 | Hoffman et al. |
| 2005/0199959 | A1 | 9/2005 | Chiang et al. |
| 2005/0282317 | A1* | 12/2005 | Ikeda ............................ 438/149 |
| 2006/0035452 | A1* | 2/2006 | Carcia et al. ................. 438/608 |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0065771 | A1* | 3/2009 | Iwasaki et al. .................. 257/43 |
| 2009/0068773 | A1 | 3/2009 | Lai et al. |
| 2009/0073325 | A1 | 3/2009 | Kuwabara et al. |
| 2009/0102539 | A1* | 4/2009 | Yeh et al. ...................... 327/419 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0068852 | A1 | 3/2011 | Yamazaki et al. |
| 2011/0127522 | A1 | 6/2011 | Yamazaki |
| 2011/0136301 | A1 | 6/2011 | Yamazaki et al. |
| 2011/0156020 | A1* | 6/2011 | Jeon et al. ....................... 257/43 |
| 2011/0181349 | A1 | 7/2011 | Yamazaki et al. |
| 2011/0193182 | A1 | 8/2011 | Takemura |
| 2011/0204362 | A1 | 8/2011 | Akimoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

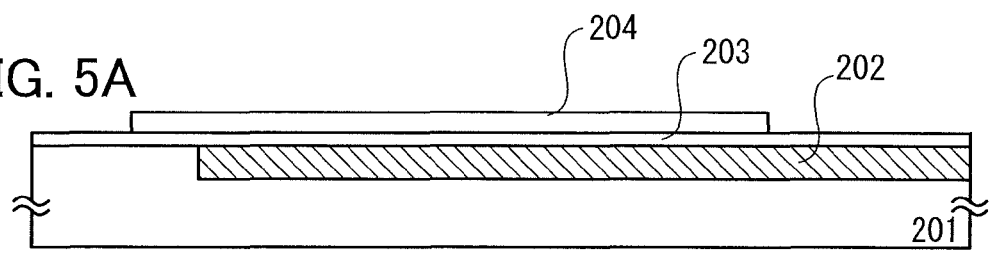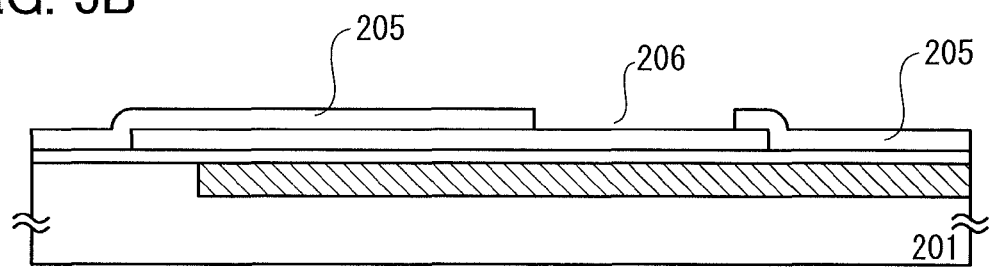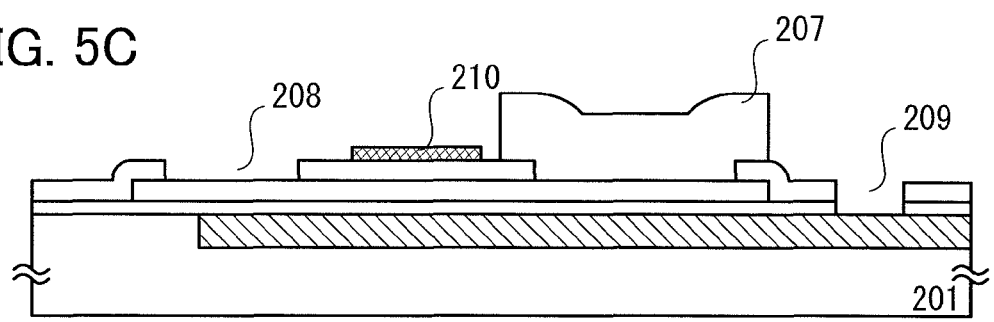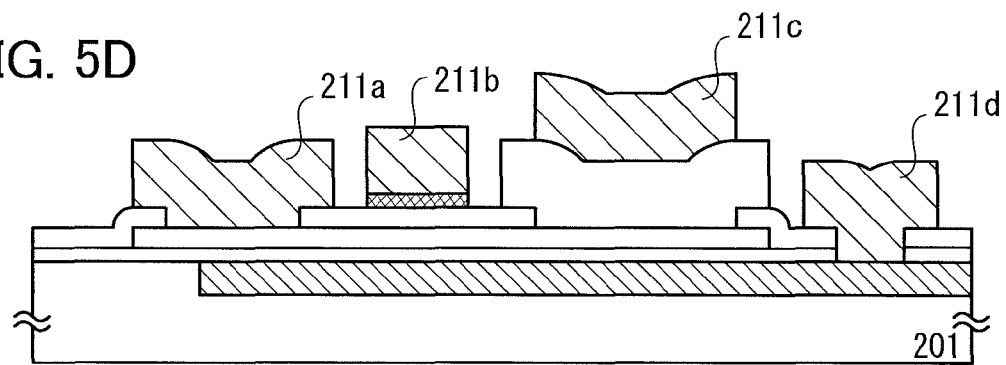

POWER-INSULATED-GATE FIELD-EFFECT TRANSISTOR

BACKGROUND OF THE INVENTION

1. Field of the Invention

One embodiment of the present invention relates to a field-effect transistor (FET) using semiconductor, in particular, to a power-insulated-gate field-effect transistor (hereinafter, referred to as a power MISFET).

2. Description of the Related Art

A field effect transistor (FET) is a device in which regions called a source and a drain are provided in a semiconductor, each of the regions is connected to an electrode (a source electrode or a drain electrode), and a voltage is applied to the semiconductor via a gate electrode through an insulating film or a Schottky barrier so that the state of the semiconductor is controlled, whereby current flowing between the source electrode and the drain electrode is controlled. As a semiconductor used, a Group 14 element such as silicon or germanium, a compound such as gallium arsenide, indium phosphide, gallium nitride, zinc sulfide, or cadmium telluride, or the like can be used.

In recent years, FETs in which an oxide such as zinc oxide or an indium gallium zinc oxide-based oxide (also referred to as In—Ga—Zn based oxide, IGZO) is used as a semiconductor have been reported (Patent Document 1 and Patent Document 2). FETs using such oxide semiconductor have relatively high mobility, and also materials of oxide semiconductors have a large band gap which is 3 eV or higher.

REFERENCE

[Patent Document 1] United States Published Patent Application No. 2005/0199879

[Patent Document 2] United States Published Patent Application No. 2007/0194379

SUMMARY OF THE INVENTION

An object of one embodiment of the present invention is to provide a power MISFET using an oxide semiconductor. Power MISFETs using silicon semiconductor have been already in practical use. However, when a withstand voltage is 60 V or lower, an on-state resistance is about 0.1Ω, whereas when a withstand voltage becomes higher, an on-state resistance is 1Ω or higher. For example, when an on-state resistance is 1Ω and on/off switching is performed with a current of 10 A, power of as much as 100 W is consumed, which is not practical. For such a usage of a high withstand voltage, an insulated gate bipolar transistor is used, however, its high frequency characteristics are inferior unfortunately.

The inventor has focused on a withstand voltage of an oxide semiconductor having a band gap of 3 eV or higher. Thus, an object of one embodiment of the present invention to provide a highly-efficient power MISFET whose on-state resistance is 0.8Ω or lower, preferably 0.2Ω or lower even at a withstand voltage of 300 V, with use of such an oxide semiconductor.

One embodiment of the present invention is a power MISFET including a gate insulating film interposed between a gate electrode and a semiconductor layer formed of an oxide semiconductor, a source electrode and a drain electrode formed in contact with the semiconductor layer, wherein the gate electrode has a region overlapping with the source electrode, not with the drain electrode, and the width of a region of the semiconductor layer which does not overlap with the drain electrode and the gate electrode is 0.5 μm to 5 μm.

One embodiment of the present invention is a power MISFET including a gate insulating film interposed between a gate electrode and a semiconductor layer formed of an oxide semiconductor, a source electrode and a drain electrode formed in contact with the semiconductor layer, wherein the thickness of the semiconductor layer is uneven and the thickness of a portion in contact with the drain electrode is 0.5 μm to 5 μm.

Between a drain electrode and a source electrode of such a power MISFET, a power of 100 V or higher and a load are connected in series, and a control signal is input to a gate electrode. Note that in any of the embodiments described above, the semiconductor layer may be interposed between the gate electrode and the back gate electrode. In addition, the gate electrode may be a region of a p-type single crystal silicon substrate or a region which is turned into a p-type by doping (p-type region), formed over an n-type single crystal silicon substrate. In addition, the gate electrode, the back gate electrode, the source electrode or the drain electrode may be formed using a metal or a conductive oxide.

Further, the concentration of carriers originated from donor or acceptor in the semiconductor layer may be $1 \times 10^{12}$ cm$^{-3}$ or lower, preferably $1 \times 10^{11}$ cm$^{-3}$ or lower. Note that when a semiconductor is in contact with a conductor, carriers are injected from the conductor or absorbed into the conductor; therefore, it is difficult to know the original concentration of carriers, which is described below. Accordingly, actually, it is difficult to know the concentration of carries originated from donor or acceptor in a semiconductor layer of an MISFET. In this case, it is possible to know whether or not the carrier concentration is $1 \times 10^{12}$ cm$^{-3}$ or lower in such a manner that a point of a semiconductor layer formed in the same manner as the semiconductor layer used in the MISFET, which is 10 μm or more away, preferably 100 μm or more away from a conductor is measured.

As for the above description, the number of oxygen vacancies and the hydrogen concentration in a semiconductor layer are preferably as small as possible. This is because oxygen vacancies or mixed hydrogen become sources of carriers. Further, inclusion of hydrogen causes unstable operation of an MISFET. The hydrogen concentration is preferably $1 \times 10^{18}$ cm$^{-3}$ or lower.

In addition, the work function of the source electrode or the drain electrode is preferably lower than the sum of the electron affinity of the semiconductor layer and 0.3 eV (i.e., electron affinity +0.3 eV). Alternatively, the contact between the semiconductor layer and the source electrode or the drain electrode is preferably an ohmic contact. In addition, the work function of the drain electrode is preferably lower than that of the source electrode.

Moreover, the work function of the gate electrode or the back gate electrode is preferably higher than that of the source electrode or the drain electrode by 0.3 eV or higher. Alternatively, the work function of the gate electrode or the back gate electrode is preferably higher than the sum of the electron affinity of the semiconductor layer and 0.6 eV (i.e., electron affinity +0.6 eV).

Before description of the present invention, a conventional power MISFET is described. FIG. 10A is a diagram illustrating a principle of a conventional power MISFET using single crystal silicon. In other words, a source 502a and a drain 502b which are formed by diffusion of an n-type impurity are formed on a p-type single crystal silicon substrate 501, and are provided with a source electrode 505a and a drain electrode 505b respectively. In addition, over the substrate, a gate electrode 504 and an insulator 506 are provided.

These structural elements are similar to those of normal MISFETs; however, in addition to these elements, in the power MISFET, a drift region 503 is provided between the drain 502b and a channel region. The drift region 503 is provided in order to absorb a high voltage applied between the drain 502b and the gate electrode 504 in the MISFET, when the MISFET is turned off.

In other words, when high voltage is applied, the drift region is depleted to be an insulator, so that an electric field of the withstand voltage or lower of silicon is applied and thus the MISFET is not broken. The width of the drift region needs 10 μm in an MISFET where the breakdown field strength of silicon is 0.3 MV/cm, and the withstand voltage is 300 V.

On the other hand, when an MISFET is turned on, the drift region should have conductivity and thus should have an n-type conductivity; however, when the concentration of donor is too high, these regions cannot be depleted sufficiently. The concentration of donor is preferably $4 \times 10^{15}$ cm$^{-3}$.

In addition, the resistivity of single crystal silicon in which the donor concentration is $4 \times 10^{15}$ cm$^{-3}$ is 1 Ωcm or more. As illustrated in FIG. 10A, when the drift region 503 is formed in a shallow portion of one surface of the substrate 501, the resistance becomes high, while as illustrated in FIG. 10B, when the drift region 503 is formed in the substrate itself and thus the cross-sectional area where current flows is made large, the resistance can be lowered. Even in that case, the resistance of the drift region is 1 Ωcm or more in order to ensure the withstand voltage of 300V.

Further, the power MISFET needs many doping steps. In other words, an n-type impurity is added to a rear surface of a single crystal silicon substrate 501 having a weak n-type conductivity, so that the drain 502b is formed. Further, after the gate electrode 504 is formed, a p-type impurity is added from the front surface to form a p-type region 507 and an n-type impurity is added from the front surface to form the source 502a. The impurity concentration of the drift region 503 is equal to that of the substrate.

On the other hand, in an oxide semiconductor having a band gap of 3 eV or more, because the breakdown field strength is 3 MV/cm or more, the width corresponding to the drift region may be 1 μM. However, although in silicon semiconductor, the conductivity in an on-state can be ensured by diffusion of a slight amount of donors into a drift region, such a technique is not established for a general oxide semiconductor.

It has been known that in an oxide semiconductor, hydrogen serves as a donor, and oxygen vacancy also becomes a factor of a donor. However, the inventor knows that hydrogen existing in an oxide semiconductor causes a big problem in reliability. On the other hand, a technique with which the concentrations of oxygen vacancies or other donor impurities can be controlled with accuracy has not found yet.

Therefore, it is very difficult that a technique relating to silicon semiconductor is applied to an oxide semiconductor. In this point, the inventor has studied the operation of an MISFET using an oxide semiconductor from the basics, and thus found out that the following structure can give an objective withstand voltage to an MISFET, and allow sufficient current to flow on an on-state.

FIG. 1A illustrates an example of the structure. The power MISFET includes, for example, an i-type semiconductor layer 101 including an oxide semiconductor, a gate electrode 102a, and a gate insulating film 104a interposed therebetween, a source electrode 103a, and a drain electrode 103b.

Similarly to silicon semiconductors, a region corresponding to a drift region is provided between a channel region and the drain electrode 103b. The length X of the region may be 1 μm long enough to ensure the withstand voltage of 300 V. In general, the length may be within the range of 0.5 μm to 5 μm.

As the length X is longer, the withstand voltage becomes higher. However, when the X is too long, the electron concentration from the drain electrode 103b to the semiconductor layer 101 (in particular, to the thick semiconductor layer 101b) in an on state is insufficient, and thus the on-state resistance is high, and thereby a sufficient function of a transistor cannot obtained unfortunately. Accordingly, it is not preferred that the X is longer than 5 μm in general.

However, if a problem is not caused when the on-state resistance is high (for example, when a current applied is enough small, and the like), a transistor can function well in some cases even when the X is longer than 5 μm. In general, the on-state resistance is preferably a tenth or lower of a load.

FIG. 1B illustrates a power MISFET which is further developed. In this FET, a portion of the semiconductor layer 101 in contact with the drain electrode 103b (semiconductor layer 101b) is formed thicker than a portion in contact with the source electrode 103a and a channel portion of a semiconductor layer 101a, and the portion is a portion corresponding to the drift region. At this time, the thickness (the length X) of the semiconductor layer 101b may be 0.5 μm to 5 μm.

In other words, the direction of flowing current is from right to left in FIG. 1A, while the direction of flowing current in a region from the drain electrode 103b and the channel is from above to below in FIG. 1B. In FIG. 1A, the cross-sectional area of the portion where current flows is a product of the thickness of the semiconductor layer 101 and the width (length perpendicular to paper) of the semiconductor layer 101, while in FIG. 1B, it is a product of the width d2 of the drain electrode and the width of the semiconductor layer 101 (or semiconductor layer 101b).

In FIG. 1A, the thickness of the portion corresponding to the drift region is limited by the thickness of the semiconductor layer 101. The thickness of the portion corresponding to the drift region is the width d2 of the drain electrode 103b in FIG. 1B. As compared to the thickness of the semiconductor layer 101, the width d2 of the drain electrode 103b can be made large easily, and thus the resistance of the portion corresponding to the drift region is lowered. For example, the d2 may be from 2 μm to 10 μm.

If the d2 is larger than 10 μm, the resistance itself per unit channel width of the region corresponding to the drift region is lowered; however, the channel width of the MISFET cannot be made large due to the restriction by a circuit layout, and as a result, it is difficult to lower the whole on-state resistance.

In addition, when the thickness of the semiconductor layer 101 illustrated in FIG. 1A is large, the resistance between the source electrode 103a and the channel is increased, and thus the on-state resistance is increased. Thus, the thickness of the semiconductor layer 101 in FIG. 1A is preferably from 10 nm to 100 nm. For the same reason, the thickness of the semiconductor layer 101a in FIG. 1B is preferably from 10 nm to 100 nm.

Moreover, in an FET not using a PN junction, when the thickness of a semiconductor layer in a channel portion is larger than a channel length, off-state leakage current is large. This effect relates to not only the thickness of the semiconductor layer but also an effective thickness of a gate insulating film (thickness×relative permittivity of the semiconductor layer/relative permittivity of the gate insulating film).

When the sum of the thickness of the semiconductor layer in the channel portion and the effective thickness of the gate insulating film is one third or more of the channel length, in particular, in an FET having a channel length of 1 μm or lower, the threshold is extremely lowered and subthreshold characteristics are also worse. In other words, the off-state current between the source electrode and the drain electrode is increased. As described later, when a high voltage is applied to the source electrode and the drain electrode in such a state, a gate insulating film is subjected to the high voltage, so that the FET is broken.

Although the details are omitted, the sum of the thickness of the semiconductor layer in the channel portion and the effective thickness of the gate insulating film may be one tenth or less, preferably one twentieth or less of the channel length.

The power MISFETs illustrated in FIG. 1A and FIG. 1B each include the gate electrode 102a and further the back gate electrode 102b with the back gate insulating film 104b interposed therebetween, on the opposite side. The back gate electrode 102b may be supplied with a potential in synchronization with the gate electrode 102a, or may be supplied with a constant potential constantly. In particular, in an off state, a potential lower than the potential of the source electrode 103a is supplied to the back gate electrode 102b, which can effectively increase the withstand voltage.

FIGS. 1A and 1B are cross-sectional views of the power MISFETs, and examples of layouts when the power MISFET in FIG. 1B is seen from above are illustrated in FIG. 2 to FIG. 4. In each of these examples, the channel width of the MISFET can be increased with use of a structure in which the source electrode 103a and the drain electrode 103b are provided in an interlocked manner. When the back gate electrode 102b is provided, it is formed between the source electrode 103a and the drain electrode 103b.

At this time, the interval d1 between the back gate electrode 102b and the drain electrode 103b illustrated in FIG. 1B should be a value taken in consideration of the withstand voltage. In consideration of a breakdown voltage of an insulator between the back gate electrode 102b and the drain electrode 103b, the d1 is preferably 0.3 μm or more. On the other hand, the large interval d1 is disadvantageous for integration, and thus the interval d1 is preferably 2 μm or lower.

Note that in order to lower the wiring resistance, the areas or thicknesses of the source electrode 103a and the drain electrode 103b can be made as large as possible. Additionally, a material with a high thermal conductance is preferably used also in view of a heat-dissipation property. In addition, as a material of the substrate, a metal or a semiconductor with a high heat-dissipation property is preferably used.

The differences among FIG. 2 to FIG. 4 are how the semiconductor layer 101 overlaps with the source electrode 103a, the back gate electrode 102b, and the drain electrode 103b. In the example of FIG. 2, the total of the portions of the semiconductor layer 101, which does not overlap with the back gate electrode 102b, the source electrode 103a, and the drain electrode 103b are three or more rectangles (in this case, fourteen rectangles). On the other hand, in FIG. 3, the total of the portions are three or more substantially-U-shapes (in this case, seven substantially-U-shapes), and in FIG. 4, the portions are two complicated shapes.

The reason why the resistance of the power MISFETs with such structures is sufficiently low is described. As for an oxide semiconductor, in particular, in an oxide semiconductor including zinc or indium, there are almost no reports on oxide semiconductors which have p-type conductivity. Accordingly, an FET using a PN junction like an FET using silicon has not been reported, and a conductor-semiconductor junction as disclosed in Patent Document 1 and Patent Document 2, where a conductor electrode is in contact with an n-type oxide semiconductor, has been used for forming a source or a drain.

According to the knowledge of the inventor, when an i-type oxide semiconductor in which the concentration of carriers originated from donor is lowered by decreasing donors (in this specification, a semiconductor the carrier concentration of which is $10^{12}$ cm$^{-3}$ or lower is also referred to as an i-type oxide semiconductor) is used for an MISFET, the MISFET can have high reliability, a large on/off ratio, and a small subthreshold value. And operation of such an MISFET using an oxide semiconductor having a low donor concentration like this is studied below.

In an MISFET where a source and a drain are formed using a conductor-semiconductor junction, when the carrier concentration in a semiconductor used is high, current (off-state current) flows between the source and the drain even in an off state. Therefore, an i-type semiconductor is obtained by lowering the carrier concentration in the semiconductor, so that the off-state current can be reduced.

In a conductor-semiconductor junction, in general, an ohmic junction or a Schottky barrier junction is formed depending on the relation between a work function of a conductor and an electron affinity (or a Fermi level) of a semiconductor. For example, if an ideal conductor-semiconductor junction (i.e., no chemical reactions or no carrier traps at the junction interface) is formed by making a conductor with a work function of 3.9 eV in contact with a semiconductor with an electron affinity of 4.3 eV, electrons flow from the conductor into a region which is in the semiconductor and has a certain width.

In that case, a region closer to a junction interface between the conductor and the semiconductor has a higher electron concentration, and the electron concentrations are $10^{20}$ cm$^{-3}$ at several nanometers from the interface of the conductor-semiconductor junction, $10^{18}$ cm$^{-3}$ at several tens of nanometers from the interface, $10^{16}$ cm$^{-3}$ at several hundreds of nanometers from the interface, and $10^{14}$ cm$^{-3}$ even at several micrometers from the interface according to rough calculation. That is, even when the semiconductor itself is an i-type semiconductor, a contact with a conductor produces a region with a high carrier concentration. Formation of such a region including many electrons in the vicinity of the interface of the conductor-semiconductor junction can make the conductor-semiconductor junction an ohmic junction.

In contrast, for example, if an ideal conductor-semiconductor junction is formed by making a conductor with a work function of 4.9 eV in contact with a semiconductor with an electron affinity of 4.3 eV, electrons existing in a region which is in the semiconductor and has a certain width move to the conductor. In the region which the electrons have left, the electron concentration is, as is obvious, extremely low. The width of the region of the semiconductor from which electrons move depends on the electron concentration of the semiconductor; for example, when an original electron concentration of the semiconductor is $10^{18}$ cm$^{-3}$, the width is about several tens of nanometers.

The electron concentration in this portion becomes significantly low; accordingly, a barrier is formed at a junction interface between the conductor and the semiconductor in a band diagram. A conductor-semiconductor junction including such a barrier is referred to as a Schottky barrier junction. Electrons easily flow from the semiconductor to the conductor, whereas electrons are less likely to flow from the conductor to the semiconductor owing to the barrier. Therefore, rectification action is observed in the Schottky barrier junction.

A similar phenomenon occurs even when a conductor is not in direct contact with a semiconductor. For example, even when an insulating film is provided between a semiconductor and a conductor, the electron concentration of the semiconductor is influenced by the conductor. Needless to say, the degree of the influence of the conductor depends on the thickness or the dielectric constant of the insulating film. When the thickness of the insulating film is increased or when the dielectric constant thereof is lowered, the influence of the conductor is reduced.

Since it is preferred that a junction between a source electrode and a semiconductor or between a drain electrode and the semiconductor is formed so that current flows easily, a conductive material of the source electrode or the drain electrode is selected so that an ohmic junction is formed. For example, titanium and titanium nitride are given. When a junction between an electrode and a semiconductor is an ohmic junction, there are advantages of stable characteristics of an MISFET to be fabricated and of high percentage of non-defective products.

As a material of a gate electrode, a material having action that eliminates electrons from a semiconductor is selected. For example, tungsten and platinum are given. Alternatively, a conductive oxide such as molybdenum oxide may be used. Some of conductive oxides have work functions of 5 eV or more. Because the conductivity of such materials are possibly inferior, they are preferably used in combination with a material with high conductivity in a stacked-layer. Alternatively, conductive nitride such as indium nitride or zinc nitride may be used.

As described above, electrons intrude into the semiconductor layer, due to the contact with the conductor; however, for example, as in the power MISFET illustrated in FIG. 1A, when the width X of the region corresponding to the drift region is 1 μm and there is no potential difference between the source electrode and the drain electrode, the electron concentration of the portion is estimated to about $1 \times 10^{16}$ cm$^{-3}$. This value is equal to or higher than the donor concentration of the drift region 503 illustrated in FIGS. 10A and 10B. Needless to say, in an off state, the region having such a thickness is easily depleted, and a voltage applied between the drain electrode and the gate electrode is absorbed in this depleted portion.

FIGS. 9A to 9C illustrate schematically electron states of the power MISFET illustrated in FIG. 1B. FIG. 9A illustrates an electron state of the semiconductor layer 101 where the potentials of the gate electrode 102a, the back gate electrode 102b, the source electrode 103a, and the drain electrode 103b are equal. Electrons flow into the semiconductor layer 101 from the source electrode 103a and the drain electrode 103b, and regions 110a and 110b with high electron concentrations are formed in the vicinity of the source electrode 103a and the drain electrode 103b.

In addition, when materials having high work functions are used for the gate electrode 102a and the back gate electrode 102b, a function of removing electrons is obtained so that the electron concentrations are extremely small in the vicinity of the gate electrode 102a and the back gate electrode 102b. The semiconductor layer 101 is thin in the vicinity of the source electrode 103a, and is close to the gate electrode 102a and the back gate electrode 102b, and thus the region 110a with high electron concentration is narrow.

On the other hand, in the vicinity of the drain electrode 103b, the semiconductor layer 101 is thick and is apart from the gate electrode 102a and the back gate electrode 102b, and thus the region 110b with a high electron concentration is wider. In order to reduce the on-state resistance, preferably, the region 110b with a high electron concentration in the vicinity of the drain electrode 103b is large and the electron concentration of the region is high. For that, a material having a low work function is preferably used as the material of the drain electrode 103b.

On the other hand, the region 110a with a high electron concentration in the vicinity of the source electrode 103a is excessively expanded, and the high electron concentration is a factor of decreasing the withstand voltage in an off state, in particular. Therefore, as the material of the source electrode 103a, a material having a work function higher than that of a material of the drain electrode 103b is preferably used.

As illustrated in FIG. 9B, when a load R is connected in series between the source electrode 103a and the drain electrode 103b, and a high positive voltage (in the range of from 100 V to a withstand voltage) is applied between the source electrode 103a and the load R, electrons in the vicinity of the drain electrode 103b are absorbed by the drain electrode 103b and the region 110b with high electron concentration vanishes. On the other hand, the region 110a with high electron concentration in the vicinity of the source electrode 103a is pulled by a high positive potential of the drain electrode 103b, and is tried unsuccessfully to expand to the drain electrode 103b side due to the hindrance of the gate electrode 102a and the back gate electrode 102b, and thus the size of the regions 110a is hardly changed.

Therefore, almost no current flows between the source electrode 103a and the drain electrode 103b, and most of voltage applied to the circuit is absorbed between the drain electrode 103b and the gate electrode 102a. If the semiconductor layer 101b and the gate insulating film 104a in this portion can withstand the voltage, the circuit and the MISFET are not broken. Even if the gate insulating film 104a is 100 nm thick or less, as long as the thickness of the semiconductor layer 101b is set such that it can withstand the voltage, the circuit and the MISFET are not broken.

If the work functions of the gate electrodes 102a and 102b are not sufficiently high, the region 110a with high electron concentration in the vicinity of the source electrode 103a expands to the drain electrode 103b side, and some electrons moves into the drain electrode 103b from the source electrode 103a. In that case, a high voltage is applied to the gate insulating film 104a and the element is broken unfortunately. Accordingly, the work functions of the gate electrode 102a and the back gate electrode 102b are important.

In particular, the back gate electrode 102b is effective for prevention of electron movement from the source electrode 103a into the drain electrode 103b. The gate electrode 102a preferably overlaps with the source electrode; however, the back gate electrode 102b is not needed to overlap with the source electrode. Note that when the potential of the back gate electrode 102b is in synchronization with the potential of the gate electrode 102a, the on-state resistance is reduced when the back gate electrode 102b overlaps with the source electrode 103a.

In addition, in silicon semiconductor, a similar effect is obtained by a reverse PN junction between the source 502a and the channel region. In an oxide semiconductor, a PN junction cannot be employed and materials having high work functions are preferably used for the gate electrode 102a and the back gate electrode 102b. Alternatively, in an off state, the potential(s) of either the gate electrode 102a or the back gate electrode 102b, or the both is/are preferably lower than the source electrode 103a by one volt or higher.

Next, as illustrated in FIG. 9C, a positive potential is supplied to the gate electrode 102a (in some cases, also to back gate electrode 102b), so that the MISFET is turned on. In FIG. 9C, the same potential as the gate electrode 102a is also supplied to the back gate electrode 102b. As a result, a channel is formed in the semiconductor layer 101, and thus the electron concentration of the whole semiconductor layer 101 is increased.

It is noticeable that the region with high electron concentration expands to the vicinity of the drain electrode 103b. This is because the resistance between the source electrode 103a and the drain electrode 103b is decreased, and the voltage therebetween is also dropped, so that electrons move into the semiconductor layer 101 (in particular, semiconductor layer 101b) from the drain electrode 103b. With such a region with high electron concentration, the on-state resistance is decreased.

As apparent from the above consideration, the withstand voltage of the MISFET illustrated in each of FIGS. 1A and 1B is sufficient. Additionally, the width of the region corresponding to the drift region is one tenth of a silicon semiconductor, so that the on-state resistance can be decreased. In addition, although there is a concern that the field effect mobility of the oxide semiconductor is as small as about one hundredth of a silicon semiconductor, on-state resistance of a power MISFET using a conventional silicon semiconductor mostly corresponds to resistance of a portion corresponding to a drift region, and there is little influence. Needless to say, if the field effect mobility is high, there is no adverse effect.

In an estimation, in the MISFET illustrated in FIG. 1B, when the channel length is 1 μm, the thickness of the gate insulating film is 25 nm (silicon oxide equivalent thickness), the field effect mobility is 10 $cm^2/Vs$, and the threshold is +1V, the on-state resistance (when the gate voltage is 10V and the drain voltage is 3 V) of the MISFET is 0.1Ω per meter of the channel width. On the other hand, when the width X of the drift region is 1 μm in order to withstand a voltage of 300 V and the width d2 of the drain electrode 103b is 3 μm, the on-state resistance of the portion is 0.5Ω per meter of the channel width. Accordingly, the power MISFET with a channel width of 5 m has an on-state resistance of 0.12Ω. As for an MISFET having the structure illustrated in FIG. 1B, the MISFET with a channel width of 5 m can be formed in a 5-mm square chip In the description of the above consideration, the semiconductor layer 101 (including the semiconductor layer 101a and the semiconductor layer 101b) is i-type. In order to obtain sufficient off-state resistance, the channel portion of the semiconductor layer 101 in the MISFET should be i-type; however, the region corresponding to the drift region is not necessarily i-type, and may include carriers originated from donor (or acceptor) that is a maximum or lower of the carrier concentration which is determined depending on a withstand voltage as needed.

For example, when the thickness of the semiconductor layer 101b in FIG. 1B is 1 μm and the withstand voltage is set to 300 V, carriers originated from donor may be contained at a concentration of $1\times10^{17}$ $cm^{-3}$ or lower. As described in this embodiment, because the semiconductor layer 101b and the semiconductor layer 101a are framed in different steps, the semiconductor layer 101a can have an i-type conductivity and the semiconductor layer 101b can have a weak n-type conductivity.

An oxide semiconductor to be used preferably contains at least indium (In) or zinc (Zn). In particular, In and Zn are preferably contained. As a stabilizer for reducing variations in electrical characteristics of an MISFET using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg—based oxide, a Sn—Mg—based oxide, an In—Mg—based oxide, or an In—Ga—based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn—based oxide, a Sn—Al—Zn-based oxide, an In—Hf—Zn—based oxide, an In—La—Zn—based oxide, an In—Ce—Zn—based oxide, an In—Pr—Zn—based oxide, an In—Nd—Zn—based oxide, an In—Sm—Zn—based oxide, an In—Eu—Zn—based oxide, an In—Gd—Zn—based oxide, an In—Tb—Zn—based oxide, an In—Dy—Zn—based oxide, an In—Ho—Zn—based oxide, an In—Er—Zn—based oxide, an In—Tm—Zn—based oxide, an In—Yb—Zn—based oxide, or an In—Lu—Zn—based oxide, a four-component metal oxide such as an In—Sn—Ga—Zn-based oxide, an In—Hf—Ga—Zn—based oxide, an In—Al—Ga—Zn—based oxide, an In—Sn—Al—Zn-based oxide, an In—Sn—Hf—Zn—based oxide, or an In—Hf—Al—Zn-based oxide can be used.

Note that here, for example, an "In—Ga—Zn-based oxide" means an oxide containing In, Ga, and Zn as its main component, in which there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from the group of Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. Even when an In—Ga—Zn-based oxide is used, the mobility can be increased by a reduction in bulk defect density.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when an MISFET is fabricated with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of 1 nm or less, preferably 0.3 nm or less, more preferably 0.1 nm or less.

Note that Ra is obtained by expanding centerline average roughness, which is defined by JIS B 0601, into three dimensions so as to be applicable to a surface. Moreover, Ra can be expressed as average value of the absolute values of deviations from a reference surface to a specific surface. Ra can be measured using an atomic force microscope (AFM).

As apparent from the above description, the power MISFET of one embodiment of the present invention has sufficient withstand voltage and low on-state resistance. In particular, the power MISFET of one embodiment of the present invention is different from a well-known power MISFET using silicon semiconductor, and there is no need to form a low concentration of donor region. The fabricating process can be thus simplified.

Note that the work function of a conductor may be a value determined by an interface with a semiconductor in a simplest assumption; however, a complex physical property such as generation of a compound of the semiconductor and the conductor due to chemical reaction or a trap of electric charge or another element is often observed at the interface in reality.

In the case where a first conductor layer with an extremely small thickness of several nanometers or less and a second conductor layer with a relatively large thickness are stacked over a semiconductor layer in this order, for example, the influence of the work function of the first conductor layer is considerably reduced. The same is applied to the gate electrode. Therefore, in application of the present invention, the design may be performed so that the work function or the like of each material at a position that is 5 nm away from an interface with the semiconductor layer satisfies favorable conditions in the present invention.

The present invention is particularly effective for a semiconductor material in which substantially only one of an electron and a hole can be used as a carrier. In other words, a favorable result can be obtained, for example, in the case where the mobility of one of the electron and the hole is 1 $cm^2$/Vs or higher whereas the mobility of the other is 0.01 $cm^2$/Vs or lower, the other does not exist as a carrier, or the effective mass of one of the electron and the hole is 100 times or more as large as that of the other.

BRIEF DESCRIPTION OF THE DRAWINGS

In the accompanying drawings:
FIGS. 5A to 5D illustrate a fabricating process of a power MISFET according to one embodiment of the present invention.

DETAILED DESCRIPTION OF THE INVENTION

Figure 1A:
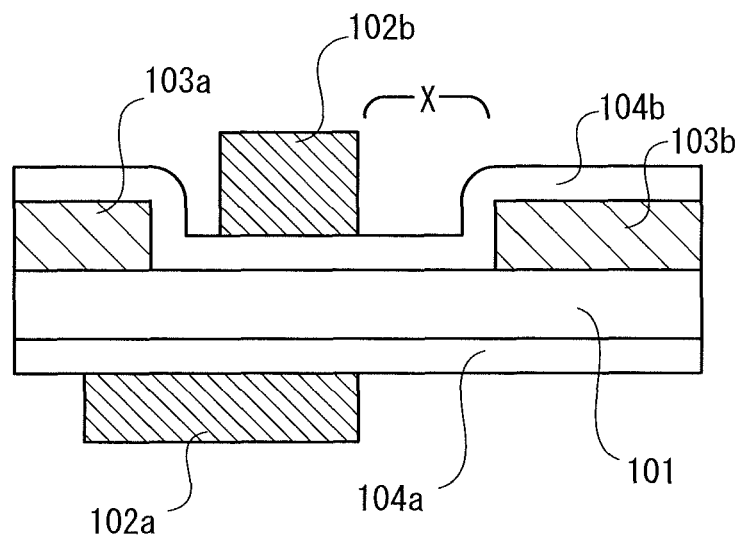
FIGS. 1A and 1B each illustrate an example of a power MISFET according to one embodiment of the present invention.

Hereinafter, embodiments will be described with reference to drawings. However, the embodiments can be implemented with different modes. It will be readily appreciated by those skilled in the art that modes and details can be changed in various ways without departing from the spirit and scope of the present invention. Therefore, the present invention is not interpreted as being limited to the description of the embodiments below. Note that in structures described below, the same portions or portions having similar functions are denoted by the same reference numerals in different drawings, and description thereof is not repeated.

Embodiment 1

Figure 1B:
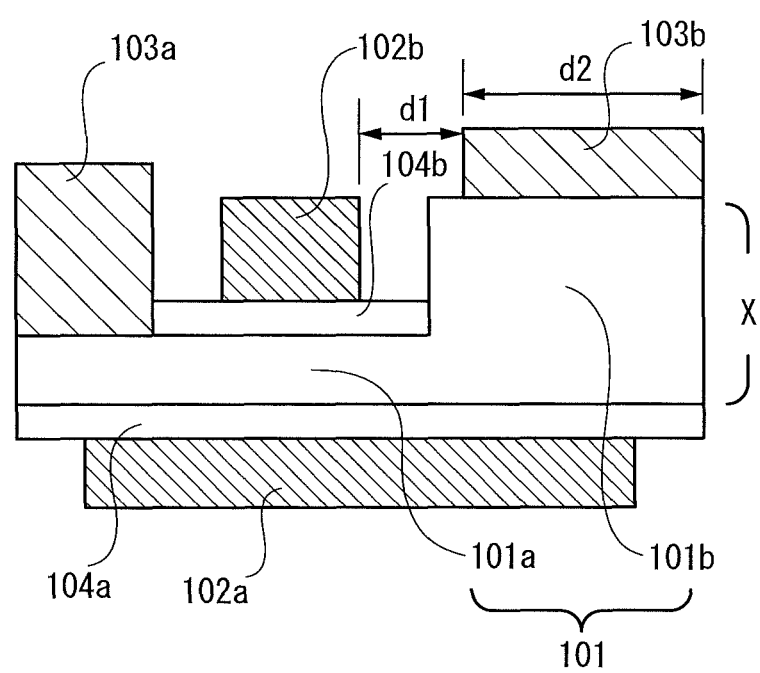
Figure 2:
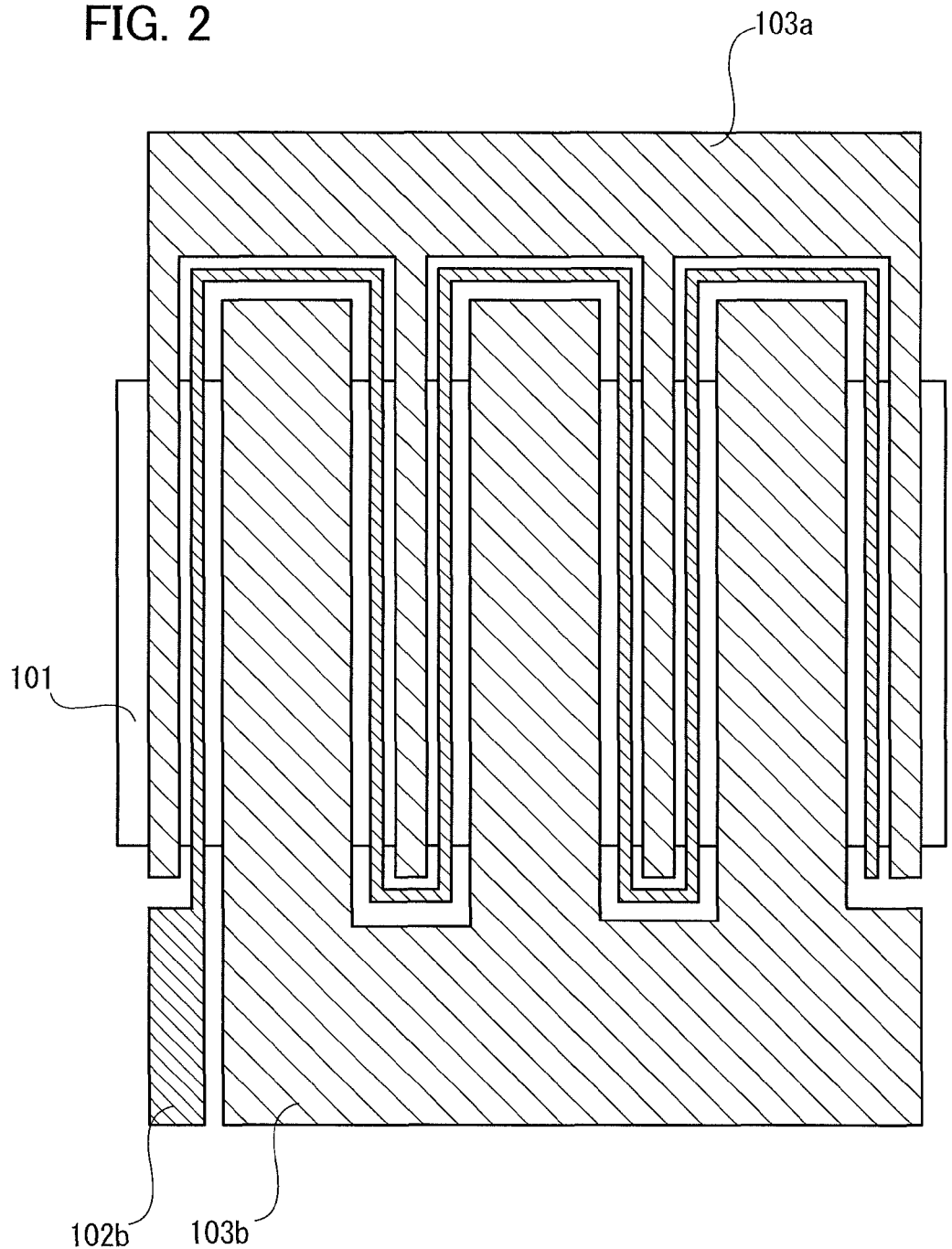
FIG. 2 illustrates an example of a power MISFET according to one embodiment of the present invention.
Figure 3:
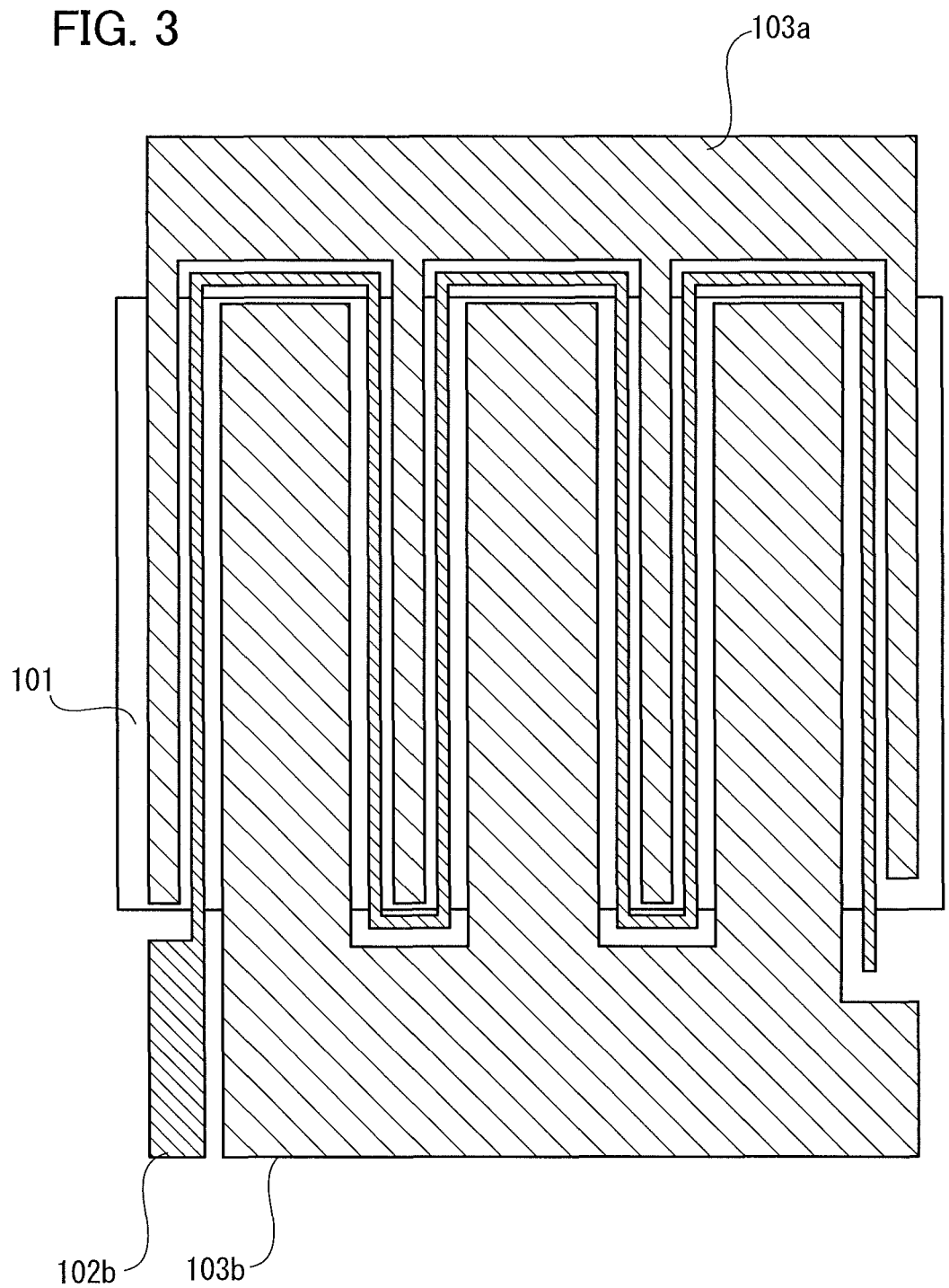
FIG. 3 illustrates an example of a power MISFET according to one embodiment of the present invention.
Figure 4:
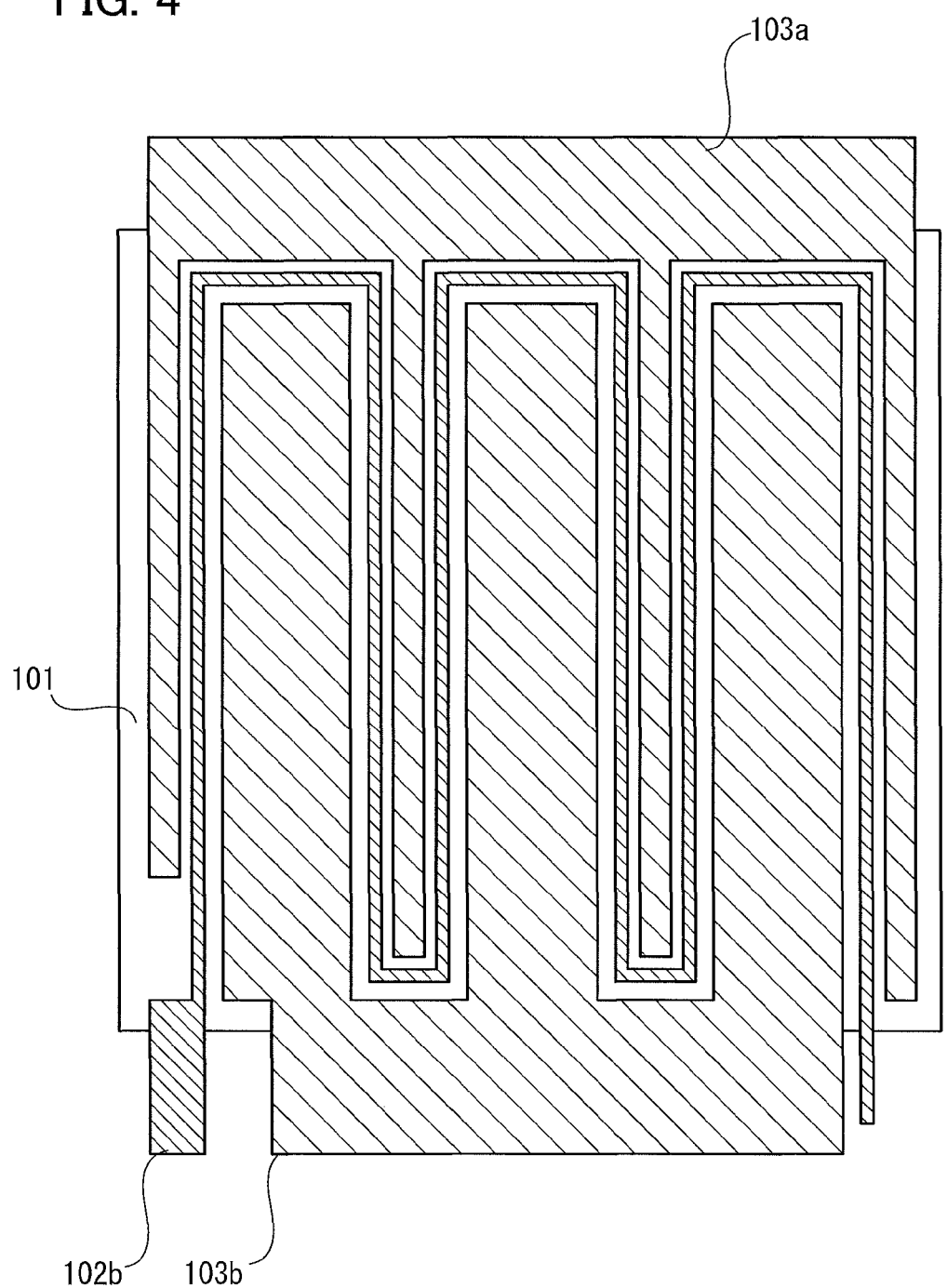
FIG. 4 illustrates an example of a power MISFET according to one embodiment of the present invention.

In this embodiment, a fabricating process of the power MISFET illustrated in FIG. 1B is described with reference to FIGS. 5A to 5D. As illustrated in FIG. 5A, a thermal-oxide film 203 is formed on a surface of an n-type single crystal silicon substrate 201. The thermal-oxide film 203 serves as a gate insulating film. The thickness may be from 20 nm to 100 nm. After that, a p-type impurity is diffused into an n-type single crystal silicon substrate 201 so that a p-type region 202 is formed. The impurity concentration of the p-type region is $2 \times 10^{20}$ $cm^{-3}$ to $5 \times 10^{21}$ $cm^{-3}$ and the semiconductor may be a degenerate p-type semiconductor. Note that before the thermal-oxide film 203 is formed, the p-type region 202 may be formed.

Further, an oxide semiconductor film with a thickness of 10 nm to 50 nm is formed. A variety kinds of oxide semiconductors can be used for the oxide semiconductor film. For example, the oxide semiconductor film may be formed by a sputtering method with use of an oxide ceramic target including indium and zinc at equal ratios. The ratio between indium and zinc is not limited to the equal ratios, and may be set as appropriate by a practitioner depending on the purpose. Furthermore, the oxide semiconductor film is selectively etched so that a first semiconductor layer 204 is formed.

Next, by a sputtering method, a plasma CVD, or the like, a back gate insulating film 205 is formed to have a thickness of 20 nm to 100 nm with use of a material of silicon oxide, silicon oxynitride, aluminum oxide, aluminum nitride, hafnium oxide, lanthanum oxide, yttrium oxide, or the like. In a portion of a region where the back gate insulating film 205 and the first semiconductor layer 204 overlap with each other, a first opening portion 206 is formed (see FIG. 5B).

Note that appropriate heat treatment is preferably performed either after formation of the first semiconductor layer 204 or after formation of the back gate insulating film 205 or at both of the timings. This heat treatment is for reducing the hydrogen concentration or oxygen vacancies in the first semiconductor layer 204, and if possible, the heat treatment is preferably performed right after formation of the first semiconductor layer 204.

Then, by a sputtering method, an oxide semiconductor film with a thickness of 0.5 μm to 5 μm is formed. The thickness may be determined in consideration of a withstand voltage of the power MISFET to be fabricated. In addition, in this embodiment, the composition of the oxide semiconductor film formed at this time is the same as that of the first semiconductor layer 204.

The oxide semiconductor film is selectively etched so that a second semiconductor layer 207 is formed. In the etching, the back gate insulating film 205 serves as an etching stopper, so that the first semiconductor layer 204 can be prevented from being etched. In addition, the back gate insulating film 205 and/or the thermal-oxide film 203 are/is selectively etched, so that a second opening portion 208 and a third opening portion 209 are formed.

After that, by a sputtering method or the like, a film of a material having a high work function such as platinum, molybdenum oxide, indium nitride, zinc nitride, or the like is formed to have a thickness of 10 nm to 50 nm, and is selectively etched so that a film 210 of a material with a high work function is formed (see FIG. 5C).

Moreover, then, by a sputtering method or the like, a film of a material with a low work function such as titanium, titanium nitride, or the like is formed to a thickness of 30 nm to 300 nm, then an aluminum film with a thickness of 300 nm to 10 μm is stacked thereover, and the stacked films are selectively are etched so that a source electrode 211a, a back gate electrode 211b, a drain electrode 211c, and a connection electrode 211d are formed (see FIG. 5D).

Through the above steps, the power MISFET is fabricated. In this embodiment, the p-type region 202 which is a degenerate p-type silicon with a work function of 5.2 eV is used as the gate electrode, in particular, the insulation between the source electrode 211a and the drain electrode 211c can be enhanced at the time of application of high voltage in an off state.

Embodiment 2

Figure 6A:
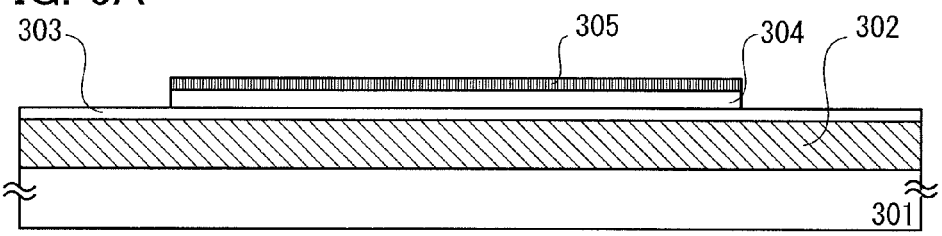
FIGS. 6A to 6E illustrate a fabricating process of a power MISFET according to one embodiment of the present invention.

In this embodiment, another method for fabricating the power MISFET will be described with reference to FIGS. 6A to 6E. First, as illustrated in FIG. 6A, a p-type impurity is diffused into a portion that is in a depth of 100 μm or more from a surface of an n-type single crystal silicon substrate 301, so that a p-type region 302 is formed. The impurity concentration of the p-type region is $2 \times 10^{20}$ cm$^{-3}$ to $5 \times 10^{21}$ cm$^{-3}$ and the p-type region 302 may be a degenerate p-type semiconductor. The p-type region serves as a gate electrode of the MISFET.

Note that the step is unnecessary if a p-type single crystal substrate doped with a high concentration of a p-type impurity is used instead of the n-type single crystal silicon substrate 301.

Next, a thermal-oxide film 303 is formed over a surface. A thermal-oxide film 303 serves as a gate insulating film. The thickness may be from 20 nm to 100 nm. Then, by the method described in Embodiment 1, an oxide semiconductor film which includes indium and zinc and has a thickness of 10 nm to 50 nm is formed. Further, a silicon nitride film with a thickness of 5 nm to 20 nm is formed thereover.

The film formation is preferably performed without the surface of the oxide semiconductor film exposed to air. In other words, a structure in which film formation devices of the oxide semiconductor film and the silicon nitride film are connected to each other, and the silicon nitride film is formed following the step of forming the oxide semiconductor film without the substrate exposed to air, or a structure in which the oxide semiconductor film and the silicon nitride film are formed in the same film-formation chamber is preferable. In this manner, it is possible to prevent water or moisture from being absorbed into the oxide semiconductor film when the surface of the oxide semiconductor film is exposed to air.

Then, these films are selectively etched so that a first semiconductor layer 304 and a barrier layer 305 are formed (see FIG. 6A).

Figure 6B:
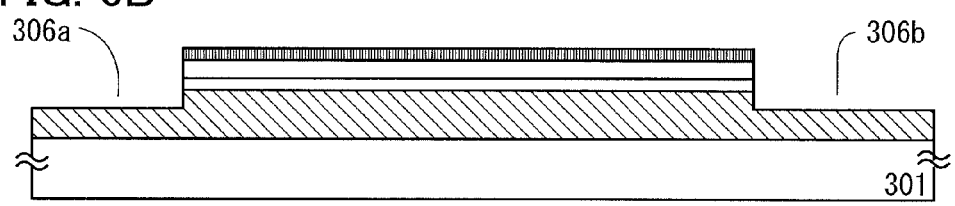

Next, with use of the barrier layer 305 as a mask, the thermal-oxide film 303 and the p-type region 302 are selectively etched so that shallow trenches 306a and 306b with a depth of 1 μm to 50 μm are formed (see FIG. 6B). After this etching, the etched surface may be thermally oxidized.

Figure 6C:
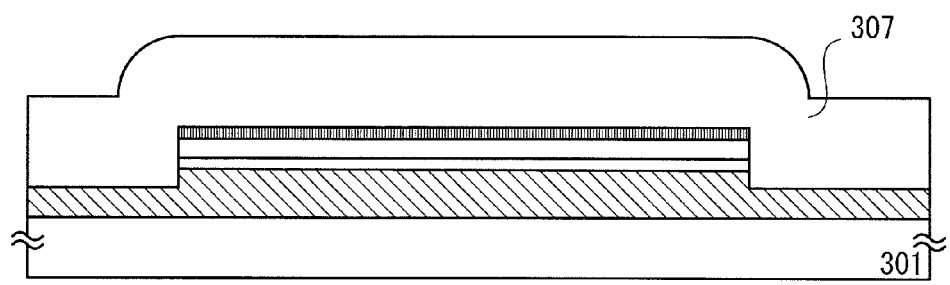
Figure 6D:
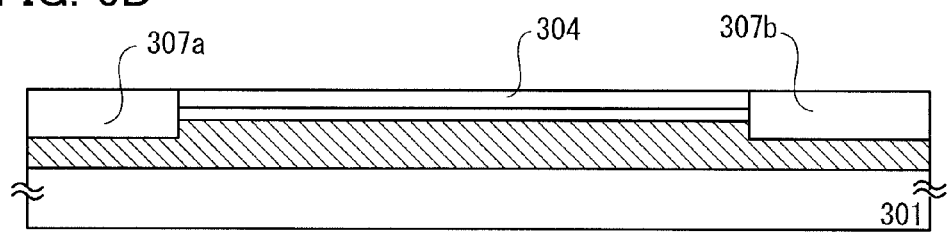

Next, by a known plasma CVD method or the like which provides a favorable step coverage, an insulator 307 such as silicon oxide, silicon oxynitride, or the like is formed (see FIG. 6C).

Then, the insulator 307 is polished by a surface planarization technique such as a chemical mechanical polishing (CMP) method. This step may be performed with the barrier layer 305 used as a stopper. After this step is finished, the barrier layer 305 is removed by a dry etching method or the like. In this manner, embedded insulators 307a and 307b are formed (see FIG. 6D).

Then, by a sputtering method, an oxide semiconductor film which includes zinc oxide as a main component and has a thickness of 0.5 μm to 5 μm is formed. The thickness may be determined in consideration of a withstand voltage of the power MISFET to be fabricated. The oxide semiconductor film is selectively etched, so that a second semiconductor layer 308 is formed. By employing a method capable of selectively etching only zinc oxide, the first semiconductor layer 304 is hardly etched, so that the second semiconductor layer 308 can be formed.

In addition, because the first semiconductor layer 304 and the second semiconductor layer 308 are formed using different materials, the properties thereof may be different. For example, the first semiconductor layer 304 may have an i-type conductivity, and the second semiconductor layer 308 may have a weak n-type conductivity (the concentration of carriers originated from donor is from $1 \times 10^{16}$ cm$^{-3}$ to $1 \times 10^{17}$ cm$^{-3}$).

Next, in the embedded insulator 307a, a contact hole reaching the p-type region 302 is formed. Then, by a sputtering method or the like, a film of a material with a low work function such as titanium, titanium nitride, or the like, and an aluminum film are stacked as a multilayer, and are selectively etched, so that a connection electrode 310a, a source electrode 310b, and a drain electrode 310c are formed. Note that in FIG. 6E, a wiring extending from the drain electrode 310c is illustrated over the embedded insulator 307b.

Figure 6E:
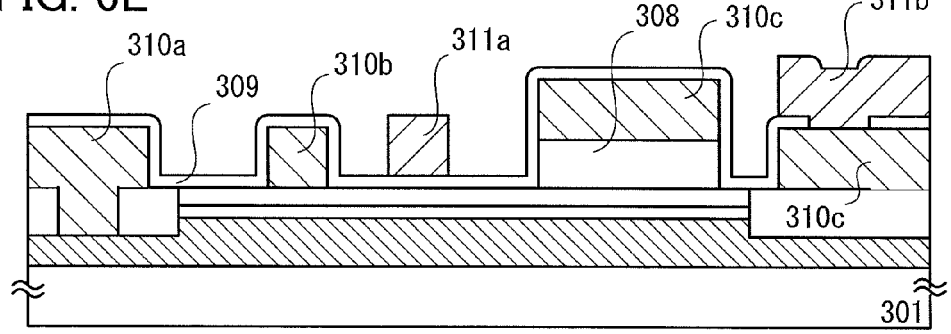

As in Embodiment 1, the back gate insulating film 309 is formed, a contact hole is formed in a wiring portion extending from the drain electrode 310c over the embedded insulator 307b, and then, by a sputtering method or the like, a film of a material having a high work function such as platinum, molybdenum oxide, indium nitride, zinc nitride, or the like and having a thickness of 10 nm to 50 nm and an aluminum film are stacked as a multilayer film, and are selectively etched, so that a back gate electrode 311a and a connection electrode 311b are formed (see FIG. 6E). Through the above steps, the power MISFET is fabricated.

Embodiment 3

Figure 7A:
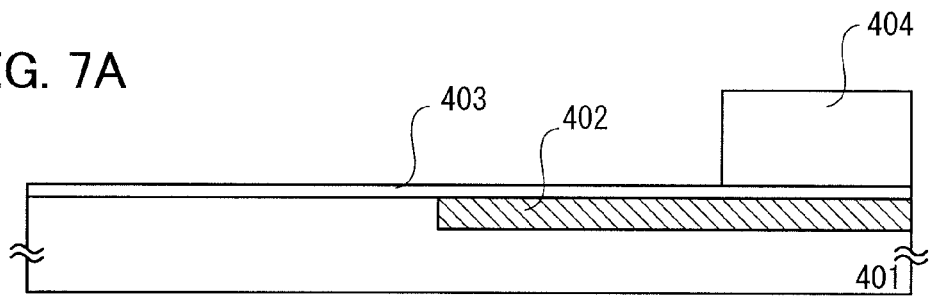
FIGS. 7A to 7D illustrate a fabricating process of a power MISFET according to one embodiment of the present invention.
Figure 7B:
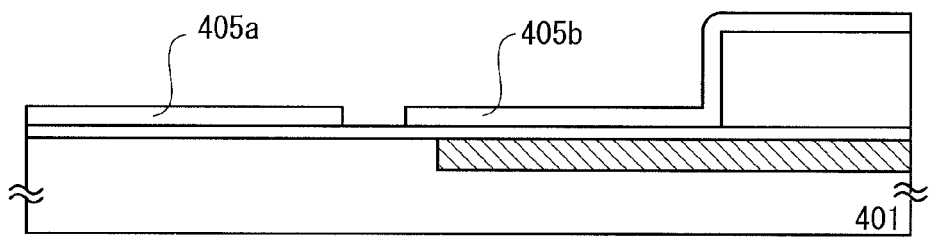

In this embodiment, another fabricating method of the power MISFET is described with reference to FIGS. 7A to 7D and FIG. 8. First, as illustrated in FIG. 7A, a thermal-oxide film 403 is formed on a surface of n-type single crystal silicon substrate 401. The thermal-oxide film 403 functions as a gate insulating film. The thickness may be from 20 nm to 100 nm.

After that, a p-type impurity is diffused into an n-type single crystal silicon substrate 401 so that a p-type region 402 is formed. The impurity concentration of the p-type region is $2 \times 10^{20}$ cm$^{-3}$ to $5 \times 10^{21}$ cm$^{-3}$ and the semiconductor may be a degenerate p-type semiconductor. Note that before the thermal-oxide film 403 is formed, the p-type region 402 may be formed.

Then, by a sputtering method, an oxide semiconductor film which includes indium and zinc and has a thickness of 0.5 μm to 5 μm is formed. The thickness may be determined in consideration of a withstand voltage of the power MISFET to be fabricated. In addition, the oxide semiconductor film is selectively etched so that a second semiconductor layer 404 is formed (see FIG. 7A).

Further, an oxide semiconductor film which includes indium and zinc and has a thickness of 10 nm to 50 nm is formed. The oxide semiconductor film is selectively etched so that first semiconductor layers 405a and 405b are formed (see FIG. 7B).

Figure 7C:
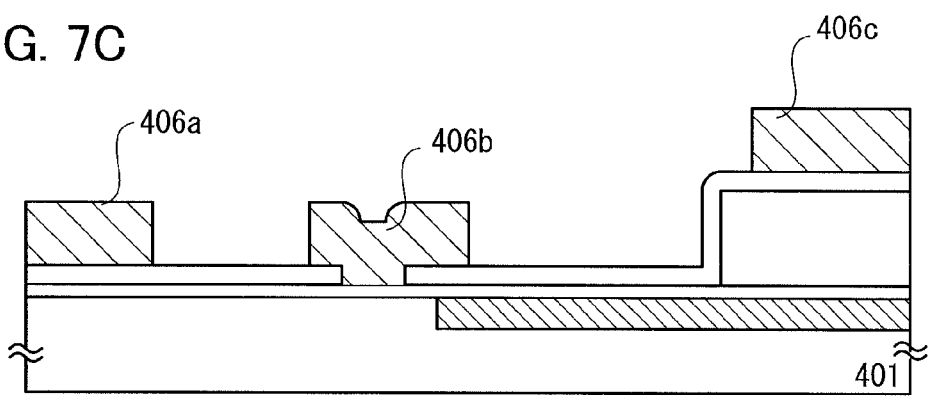

Then, by a sputtering method or the like, a film of a material with a low work function such as titanium, titanium nitride, or the like, and with a thickness of from 30 nm to 300 nm and an aluminum film with a thickness of from 300 nm to 10 μm are stacked as a multilayer, and are selectively etched, so that a first electrode 406a, a second electrode 406b, and a third electrode 406c are formed (see FIG. 7C).

The first electrode 406a serves as a drain electrode of a diode, the second electrode 406b serves as a source electrode of the diode and a source electrode of the MISFET, and the third electrode 406c serves as a drain electrode of the MISFET.

Next, by a sputtering method, a plasma CVD, or the like, a back gate insulating film 407 is formed to have a thickness of from 20 nm to 100 nm with use of a material of silicon oxide, silicon oxynitride, aluminum oxide, aluminum nitride, hafnium oxide, lanthanum oxide, yttrium oxide, or the like. In the back gate insulating film 407 over the first electrode 406a, an opening portion is formed.

Figure 7D:
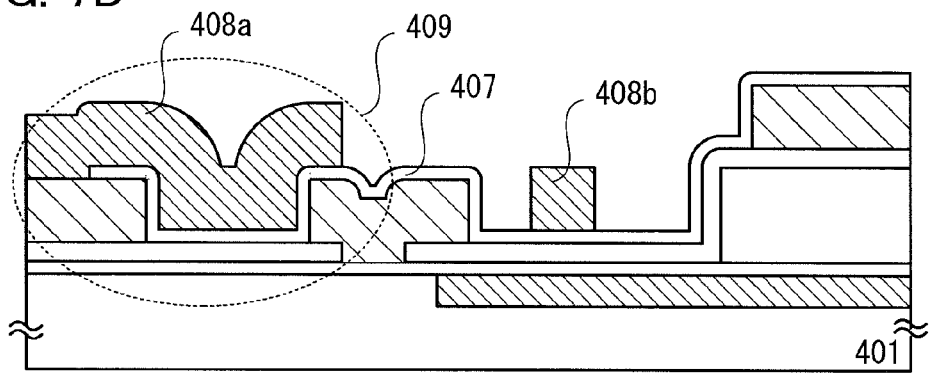

Then, by a sputtering method or the like, a film of a material having a high work function such as platinum, molybdenum oxide, indium nitride, zinc nitride, or the like is formed to have a thickness of 10 nm to 50 nm and an aluminum film are stacked as a multilayer film, and are selectively etched, so that a back gate electrode 408a of the diode and a back gate electrode 408b are formed (see FIG. 7D).

The first semiconductor layer 405a, the first electrode 406a, and the gate electrode 408a of the diode are in contact with each other to form the diode 409 as illustrated in FIG. 7D. The forward direction of the diode 409 is from the first electrode 406a to the second electrode 406b.

Figure 8:
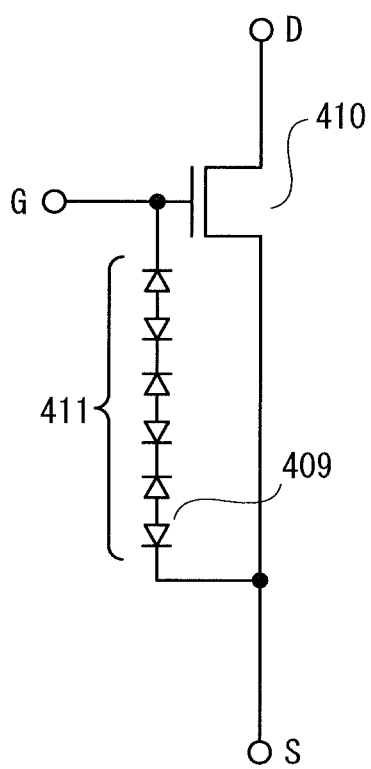
FIG. 8 is a circuit diagram of a power MISFET according to one embodiment of the present invention.
Figure 9A:
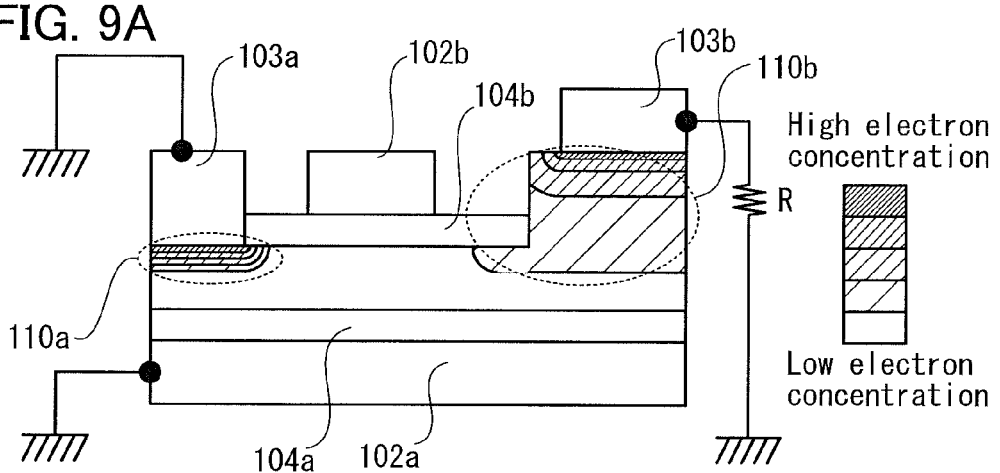
FIGS. 9A to 9C each illustrate an electron state of a power MISFET according to one embodiment of the present invention.
Figure 9B:
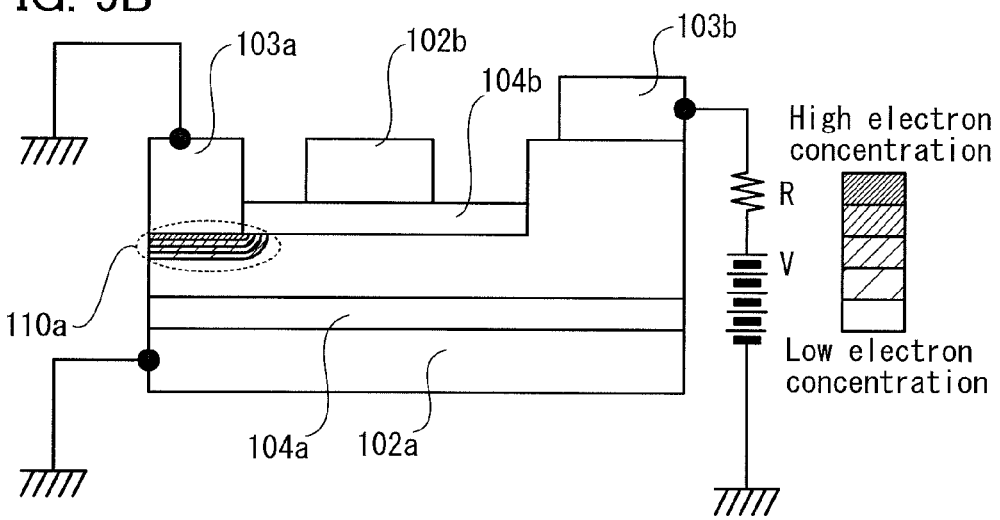
Figure 9C:
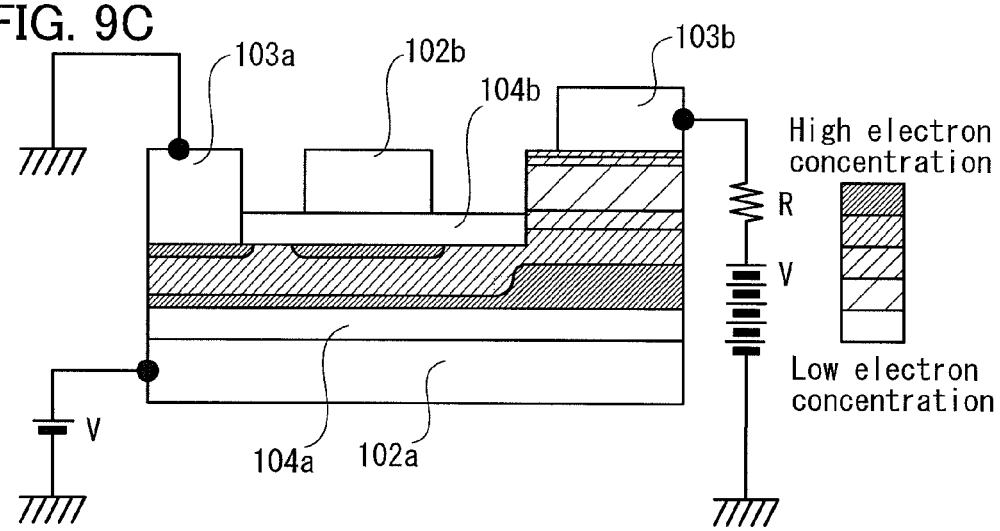
Figure 10A:
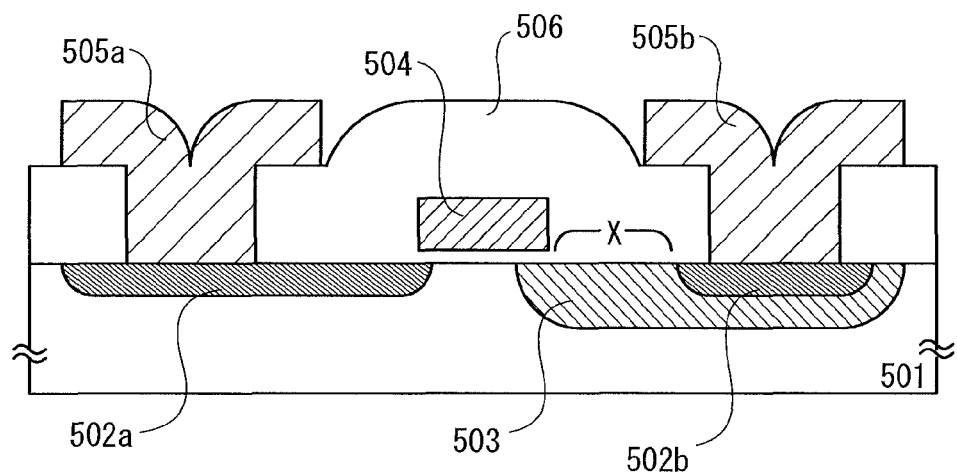
FIGS. 10A and 10B illustrate examples and operation of a conventional power MISFET.
Figure 10B:
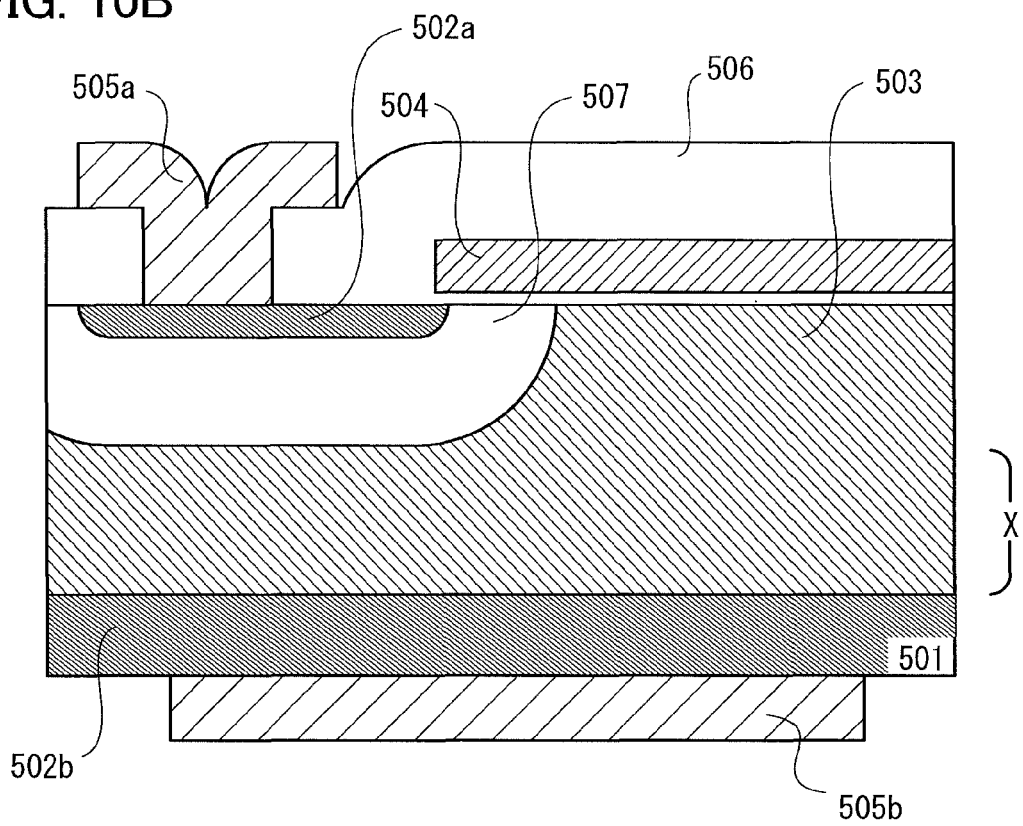

As illustrated in the circuit diagram of FIG. 8, a plurality of such diodes are provided between the gate electrode and the second electrode 406b, so that a gate protective diode column 411 is formed. With such a circuit, the power MISFET 410 can be prevented from being broken when a voltage exceeding a prescribed voltage is applied to the gate of the power MISFET 410.

This application is based on Japanese Patent Application serial no. 2010-212185 filed with Japan Patent Office on Sep. 22, 2010, the entire contents of which are hereby incorporated by reference.

What is claimed is:

1. A power insulated gate field effect transistor comprising:
a gate electrode;
an oxide semiconductor layer over the gate electrode, the oxide semiconductor layer comprises a first portion and a second portion;
one of a source and a drain electrode over and in direct contact with the second portion; and
the other of the source and the drain electrode over and in direct contact with the first portion,
wherein:
the one of the source and the drain electrode is a source electrode;
the other of the source and the drain electrode is a drain electrode;
all of the first portion overlaps with a first part of the gate electrode;
at least a part of the drain electrode overlaps with the all of the first portion;
all of the second portion overlaps with a second part of the gate electrode;
at least a part of the source electrode overlaps with the all of the second portion;
a thickness of the first portion is larger than a thickness of the second portion; and
the thickness of the first portion is from 0.5 μm to 5 μm.

2. The power insulated gate field effect transistor according to claim 1, wherein the oxide semiconductor layer is interposed between the gate electrode and a back gate electrode.

3. The power insulated gate field effect transistor according to claim 1, wherein a concentration of carriers originated from donor or acceptor in the oxide semiconductor layer is $1 \times 10^{12}$ cm$^{-3}$ or lower.

4. The power insulated gate field effect transistor according to claim 1, wherein a concentration of hydrogen in the oxide semiconductor layer is $1 \times 10^{18}$ cm$^{-3}$ or lower.

5. The power insulated gate field effect transistor according to claim 1, wherein each one of a work function of a portion of the one of the source and the drain electrode, which is in contact with the oxide semiconductor layer, and a work function of a portion of the other of the source and the drain electrode, which is in contact with the oxide semiconductor layer, is smaller than a sum of an electron affinity of the oxide semiconductor layer and 0.3 eV.

6. The power insulated gate field effect transistor according to claim 1, wherein a work function of the one of the source and the drain electrode is higher than a work function of the other of the source and the drain electrode.

7. The power insulated gate field effect transistor according to claim 1, wherein a junction between the oxide semiconductor layer and the one of the source and the drain electrode is an ohmic contact, and wherein a junction between the oxide semiconductor layer and the other of the source and the drain electrode is an ohmic contact.

8. The power insulated gate field effect transistor according to claim 1, wherein a work function of a portion of the gate electrode, which is in contact with a gate insulating film, is larger than a sum of an electron affinity of the oxide semiconductor layer and 0.6 eV.

9. The power insulated gate field effect transistor according to claim 1, wherein the thickness of the second portion is from 10 nm to 100 nm.

10. The power insulated gate field effect transistor according to claim 1, wherein a width of the other of the source and the drain electrode is from 2 μm to 10 μm.

11. The power insulated gate field effect transistor according to claim 2, wherein an interval between the back gate electrode and the other of the source and the drain electrode is from 0.3 μm to 2 μm.

12. The power insulated gate field effect transistor according to claim 1, wherein an on-state resistance of the power insulated gate field effect transistor is 0.8Ω or lower at a withstand voltage of 300 V.

13. The power insulated gate field effect transistor according to claim 1, further comprising a power of 100 V or higher and a load electrically connected in series between the one of the source and the drain electrode and the other of the source and the drain electrode.

14. The power insulated gate field effect transistor according to claim 1, wherein each one of the first portion and the second portion has an i-type conductivity.

15. The power insulated gate field effect transistor according to claim 1, wherein:
the oxide semiconductor layer is interposed between the gate electrode and a back gate electrode;
a work function of the one of the source and the drain electrode is higher than a work function of the other of the source and the drain electrode;
the thickness of the second portion is from 10 nm to 100 nm;
a width of the other of the source and the drain electrode is from 2 μm to 10 μm;
an interval between the back gate electrode and the other of the source and the drain electrode is from 0.3 μm to 2 μm; and
each one of the first portion and the second portion has an i-type conductivity.

16. A power insulated gate field effect transistor comprising:
a gate electrode;
an oxide semiconductor layer over the gate electrode, the oxide semiconductor layer comprises a first portion and a second portion; and
one of a source and a drain electrode over and in direct contact with the first portion,
wherein:
the one of the source and the drain electrode is a drain electrode;
the second portion is included in a channel region in the oxide semiconductor layer;
all of the first portion overlaps with a first part of the gate electrode;
at least a part of the drain electrode overlaps with the all of the first portion;

all of the second portion overlaps with a second part of the gate electrode;
a thickness of the first portion is larger than a thickness of the second portion; and
the thickness of the first portion is from 0.5 μm to 5 μm.

17. The power insulated gate field effect transistor according to claim 16, wherein the oxide semiconductor layer is interposed between the gate electrode and a back gate electrode.

18. The power insulated gate field effect transistor according to claim 16, wherein a concentration of carriers originated from donor or acceptor in the oxide semiconductor layer is $1\times10^{12}$ cm$^{-3}$ or lower.

19. The power insulated gate field effect transistor according to claim 16, wherein a concentration of hydrogen in the oxide semiconductor layer is $1\times10^{18}$ cm$^{-3}$ or lower.

20. The power insulated gate field effect transistor according to claim 16, wherein each one of a work function of a portion of the one of the source and the drain electrode, which is in contact with the oxide semiconductor layer, and a work function of a portion of the other of the source and the drain electrode, which is in contact with the oxide semiconductor layer, is smaller than a sum of an electron affinity of the oxide semiconductor layer and 0.3 eV.

21. The power insulated gate field effect transistor according to claim 16, wherein a work function of the other of the source and the drain electrode is higher than a work function of the one of the source and the drain electrode.

22. The power insulated gate field effect transistor according to claim 16,
wherein a junction between the oxide semiconductor layer and the one of the source and the drain electrode is an ohmic contact, and
wherein a junction between the oxide semiconductor layer and the other of the source and the drain electrode is an ohmic contact.

23. The power insulated gate field effect transistor according to claim 16, wherein a work function of a portion of the gate electrode, which is in contact with a gate insulating film, is larger than a sum of an electron affinity of the oxide semiconductor layer and 0.6 eV.

24. The power insulated gate field effect transistor according to claim 16, wherein the thickness of the second portion is from 10 nm to 100 nm.

25. The power insulated gate field effect transistor according to claim 16, wherein a width of the one of the source and the drain electrode is from 2 μm to 10 μm.

26. The power insulated gate field effect transistor according to claim 17, wherein an interval between the back gate electrode and the one of the source and the drain electrode is from 0.3 μm to 2 μm.

27. The power insulated gate field effect transistor according to claim 16, wherein an on-state resistance of the power insulated gate field effect transistor is 0.8Ω or lower at a withstand voltage of 300 V.

28. The power insulated gate field effect transistor according to claim 16, further comprising a power of 100 V or higher and a load electrically connected in series between the one of the source and the drain electrode and the other of the source and the drain electrode.

29. The power insulated gate field effect transistor according to claim 16, wherein each one of the first portion and the second portion has an i-type conductivity.

30. The power insulated gate field effect transistor according to claim 16, wherein:
the oxide semiconductor layer is interposed between the gate electrode and a back gate electrode;

a work function of the other of the source and the drain electrode is higher than a work function of the one of the source and the drain electrode;

the thickness of the second portion is from 10 nm to 100 nm;

a width of the one of the source and the drain electrode is from 2 μm to 10 μm;

an interval between the back gate electrode and the one of the source and the drain electrode is from 0.3 μm to 2 μm; and each one of the first portion and the second portion has an i-type conductivity.

* * * * *